United States Patent
Chen et al.

(10) Patent No.: US 9,110,130 B2
(45) Date of Patent: Aug. 18, 2015

(54) PROBE HEAD OF PROBE CARD AND MANUFACTURING METHOD OF COMPOSITE BOARD OF PROBE HEAD

(75) Inventors: Ming-Chi Chen, Hsinchu Hsiang (TW); Horng-Kuang Fan, Hsinchu Hsiang (TW); Mao-Fa Shen, Hsinchu Hsiang (TW); Ming-Chu Chueh, Hsinchu Hsiang (TW); Bang-Shun Liu, Hsinchu Hsiang (TW); Che-Wei Lin, Hsinchu Hsiang (TW)

(73) Assignee: MPI Corporation, Chu-Pei (TW)

( * ) Notice: Subject to any disclaimer, the term of this patent is extended or adjusted under 35 U.S.C. 154(b) by 745 days.

(21) Appl. No.: 13/178,501

(22) Filed: Jul. 8, 2011

(65) Prior Publication Data

US 2012/0007627 A1 Jan. 12, 2012

(30) Foreign Application Priority Data

Jul. 12, 2010 (TW) .............................. 99122873 A

(51) Int. Cl.
*G01R 31/00* (2006.01)
*G01R 31/28* (2006.01)
*G11B 5/455* (2006.01)

(52) U.S. Cl.
CPC ............ *G01R 31/2889* (2013.01); *G11B 5/455* (2013.01); *H05K 2201/10378* (2013.01); *Y10T 156/1057* (2015.01)

(58) Field of Classification Search
CPC .. G01R 31/2886; G01R 31/2887; G01R 3/00; G01R 1/07357; G01R 31/2851; G01R 1/07307; G01R 1/0735; G01R 1/07314; G01R 1/07378; G01R 31/2889; G11B 5/455; H05K 2201/10378

USPC ....... 324/754, 756.03, 158 F, 756.01, 756.04, 324/756.05

See application file for complete search history.

(56) References Cited

U.S. PATENT DOCUMENTS

| | | | |
|---|---|---|---|
| 4,845,513 A * | 7/1989 | Sugata et al. .................. | 347/204 |
| 5,612,110 A * | 3/1997 | Watremez ..................... | 428/66.2 |
| 6,297,657 B1 * | 10/2001 | Thiessen et al. ......... | 324/754.13 |
| 6,356,089 B2 * | 3/2002 | Bayer et al. ............... | 324/750.25 |
| 6,378,670 B1 * | 4/2002 | Kawakami et al. ............ | 188/256 |
| 2002/0041189 A1 * | 4/2002 | Okubo et al. .................. | 324/754 |
| 2003/0146769 A1 * | 8/2003 | McQuade et al. ............. | 324/754 |
| 2005/0110506 A1 * | 5/2005 | Crippa et al. .................. | 324/754 |
| 2006/0251887 A1 * | 11/2006 | Welsch .......................... | 428/339 |
| 2008/0094088 A1 * | 4/2008 | Eldridge et al. .............. | 324/760 |
| 2009/0219042 A1 * | 9/2009 | Sasaki et al. .................. | 324/754 |
| 2009/0284272 A1 * | 11/2009 | Yonezawa et al. ............ | 324/754 |

* cited by examiner

*Primary Examiner* — Huy Q Phan
*Assistant Examiner* — Dustin Dickinson
(74) *Attorney, Agent, or Firm* — Ding Yu Tan

(57) ABSTRACT

A probe head of vertical probe card and a manufacturing method of a composite board thereof are provided. The probe head includes guide plate, composite board, and probe pin. The composite board includes first board layer and second board layer which are laminated together by joining operation. The composite board further includes through hole which is made by drilling and passed all the way through the first board layer and the second board layer. The friction coefficient of the first board layer is less than that of the second board layer, and the thermal expansion coefficient of the second board layer is less than that of the first board layer. The probe pin is penetrated all the way through the through hole of the composite board. By this, friction between the probe pin and composite board is reduced so as to stabilize the position of the probe pin.

9 Claims, 5 Drawing Sheets

PROBE HEAD OF PROBE CARD AND MANUFACTURING METHOD OF COMPOSITE BOARD OF PROBE HEAD

FIELD OF THE INVENTION

The invention relates to a probe card for electrical testing, especially relates to a probe head of a vertical probe card and a manufacturing method of a composite board thereof.

BACKGROUND OF THE INVENTION

A vertical probe card is generally used in testing of dies of flip chip packages, and in the parallel testing of multi dies surrounding a pad. As shown in FIG. 1, a probe head of a vertical probe card is disposed under a circuit board (not shown), so that the top end and the bottom end thereof are electrically connect to an electronic device under test and the circuit board, respectively. The probe head includes a top guide plate 1, a bottom guide plate 2, and a plurality of probe pins 3. The probe pins 3 are penetrated through the top guide plate 1 and the bottom guide plate 2, so as to be supported and positioned. Due to the densely disposed electronic devices under test, the probe pins 3 are thereby arranged tightly. During the testing process, the tips 3a of the probe pins 3 are aligned with and contacted to a plurality of electronic devices under test 4, thus are electrically connecting to the electronic devices 4.

In a known conventional vertical probe card, the top guide plate and the bottom guide plate are made of plastic material. The thermal expansion coefficient of the plastic material is much larger than that of silicon, which is the primary material of the electronic devices under test 4. Therefore, during the electrical testing in a higher or a lower temperature, the deformation of the guide plate, especially the deformation of the bottom guide plate, is larger than the deformation of the electronic devices under test 4 due to the difference between the thermal expansions of the different materials. And this indirectly leads to the offset of the probe pins 3, and thus causing the probe pins 3 to not align with the electronic devices under test 4.

In another known conventional vertical probe card, the top guide plate and the bottom guide plate are made of the ceramic material. The thermal expansion coefficient of the ceramic material is similar to silicon, which is the primary material of the electronic device under test 4, so as to improve upon the disadvantageous offset of the probe pins 3 caused by the above described plastic guide plate in the higher or lower temperature testing. However, the friction coefficient of the ceramic guide plate, with especially the friction coefficient of the bottom guide plate, is larger, so that during the electrical testing of the electronic device under test 4 by using the probe card, the rubbing contact between the ceramic guide plate and the probe pins 3 leads to the forming of the powder debris, thus causing problems relating to poor probe pin mobility and stuck probe pin. Therefore, the guide plate made of ceramic material leave something more to be desired.

SUMMARY OF THE INVENTION

One aspect of the present invention is to provide a probe head of a vertical probe card, so as to stabilize the position of the probe pins, for ensuring the mobility of the probe pins, and preventing the problem of stuck probe pin.

Another aspect of the present invention is to provide a manufacturing method of a composite board of a probe head of a vertical probe card, which has advantage of easy processing and simpler assembling.

To achieve the foregoing aspect of the present invention, a probe head of the vertical probe card is provided. The probe head includes a guide plate, a composite board, and at least one probe pin. The composite board is disposed under the guide plate and includes a first board layer and a second board layer which are laminated together. The composite board further includes a through hole which is passed all the way through the first board layer and the second board layer. The friction coefficient of the first board layer is less than the friction coefficient of the second board layer, and the thermal expansion coefficient of the second board layer is less than the thermal expansion coefficient of the first board layer. One end of the probe pin is supported by the guide plate, and another end of the probe pin is penetrated all the way through the through hole of the composite board. The outer diameter of the probe pin is smaller than the diameter of the through hole of the composite board. By this, the position of the probe pin is stabilized.

To achieve the foregoing aspect of the present invention, a manufacturing method of the above described composite board is provided. The manufacturing method includes the following steps. At first, a first board layer is provided. Then, a second board layer is provided. The friction coefficient of the first board layer is less than the friction coefficient of the second board layer, and the thermal expansion coefficient of the second board layer is less than the thermal expansion coefficient of the first board layer. Thereafter, a joining operation is performed so as to laminate the first board layer and the second board layer together. A drilling operation is performed so as to form at least one through hole which is passed all the way through the first board layer and the second board layer. Therefore, the composite board of the vertical probe card is then formed.

DETAILED DESCRIPTION OF THE INVENTION

Figure 1:
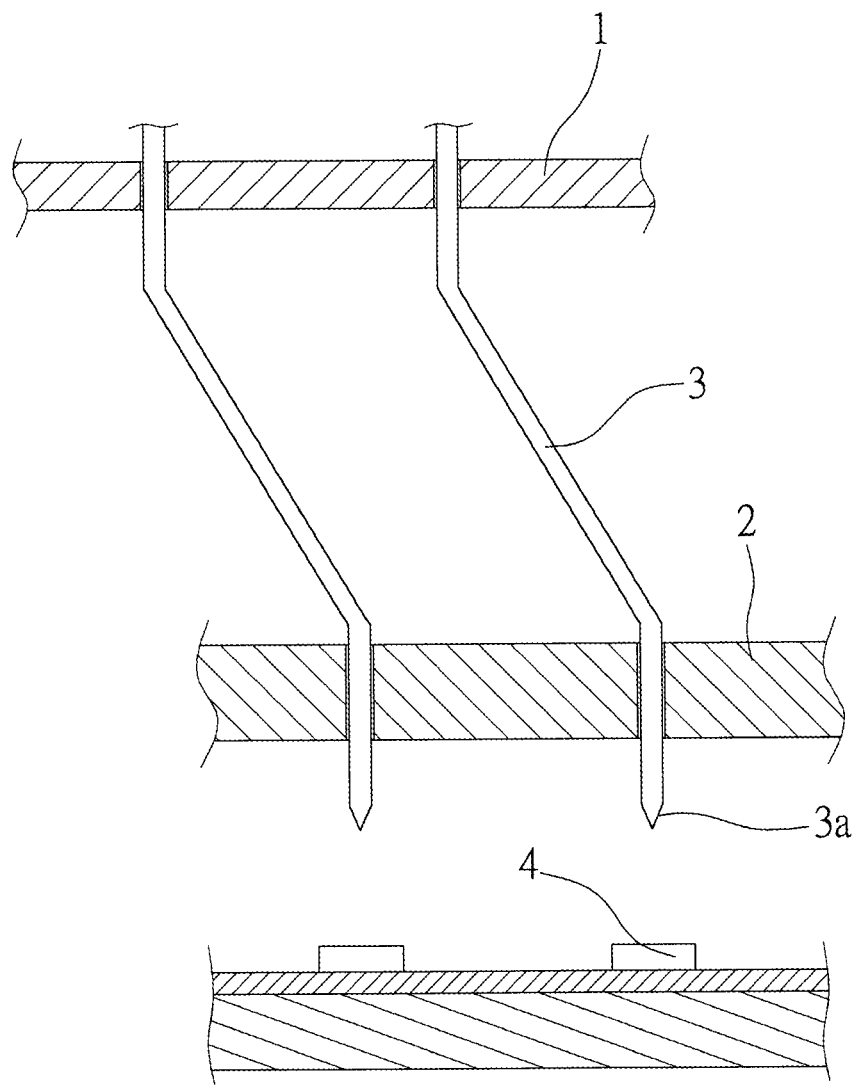
FIG. 1 is a diagram of a conventional vertical probe card.
Figure 2:
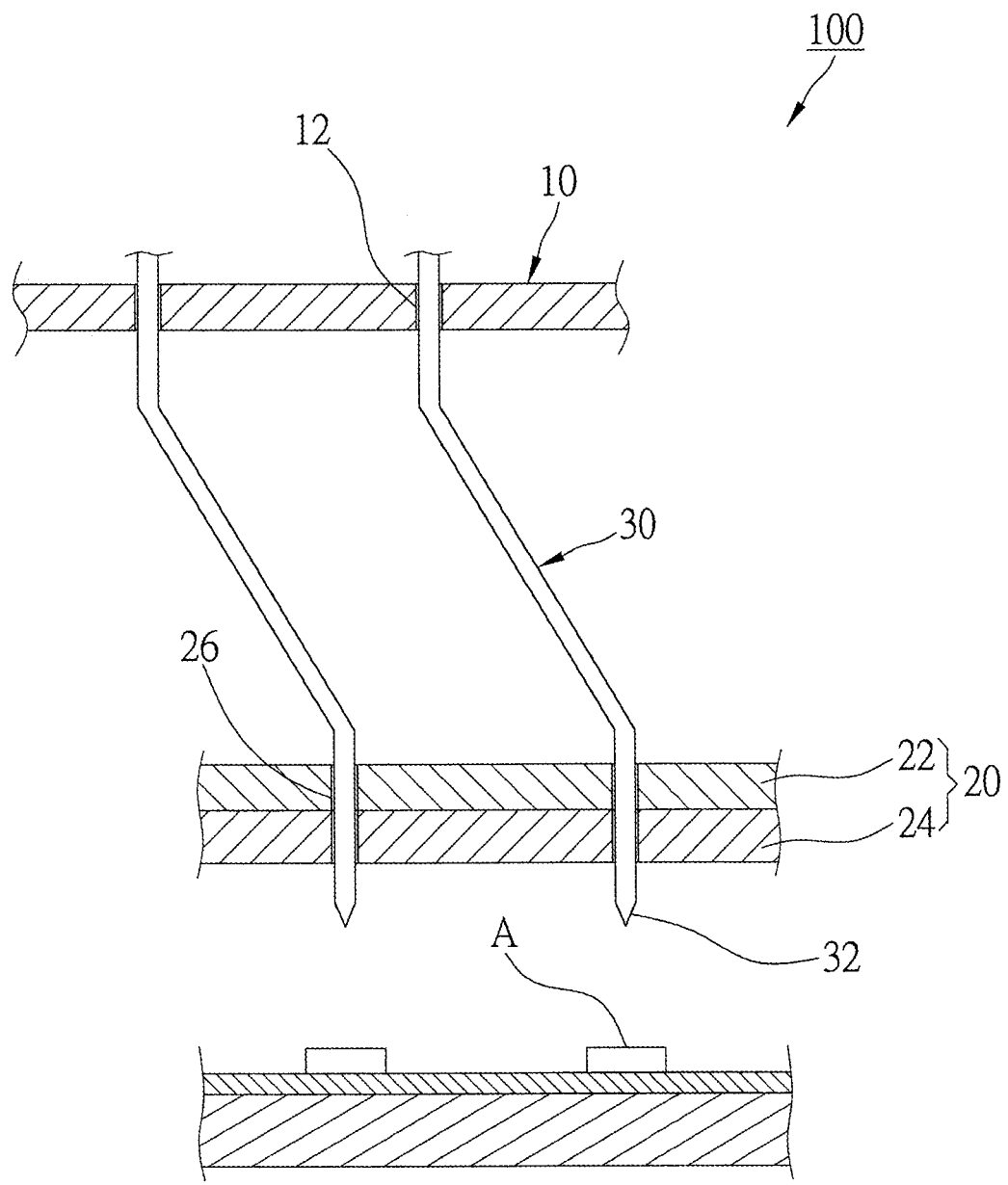
FIG. 2 is a diagram of a vertical probe card according to an embodiment of the present invention.

FIG. 2 is a diagram of a probe head of a vertical probe card according to an embodiment of the present invention. The probe head 100 includes a guide plate 10, a composite board 20, and a plurality of probe pins 30. The guide plate 10 has a plurality of through holes 12.

Figure 3:
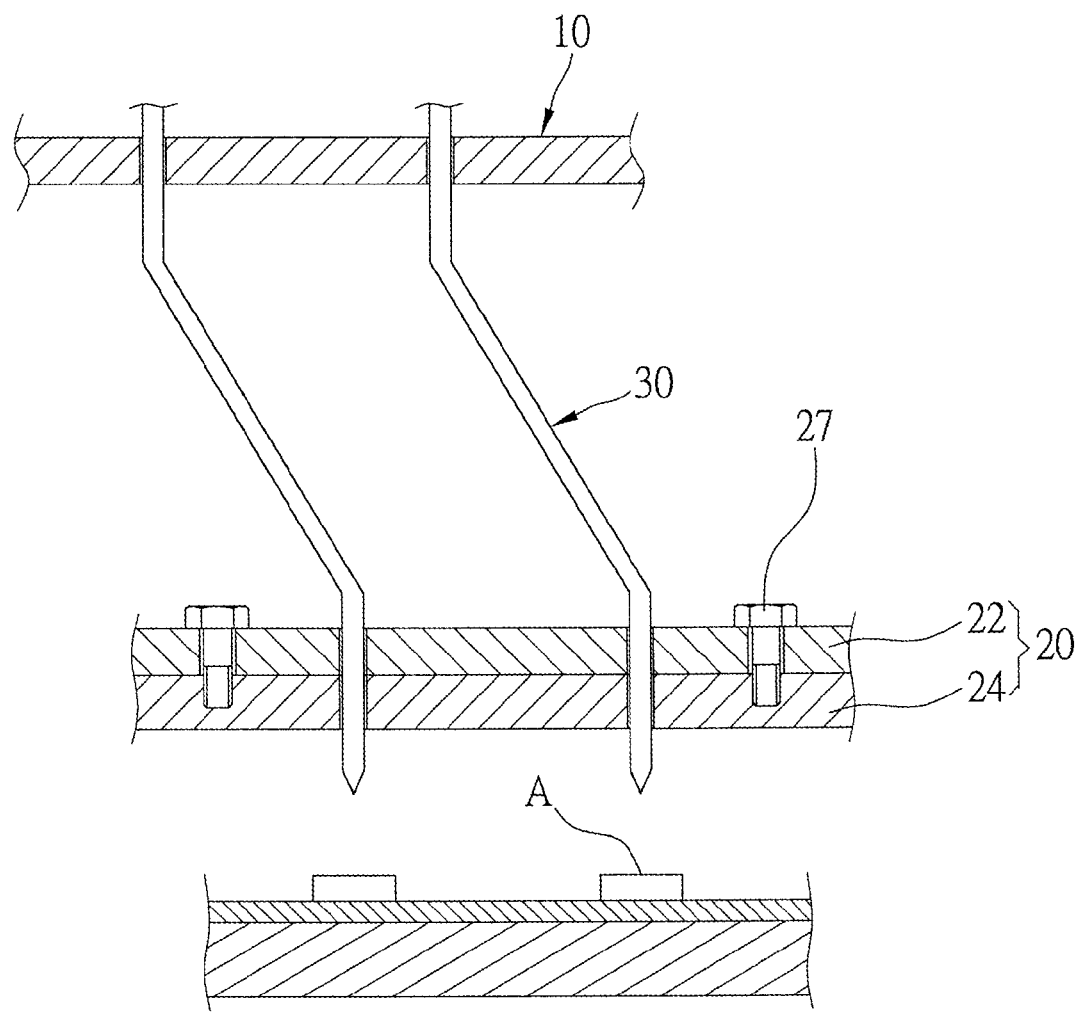
FIG. 3 is similar to FIG. 2 and shows the joining method between the first board layer and the second board layer.
Figure 4:
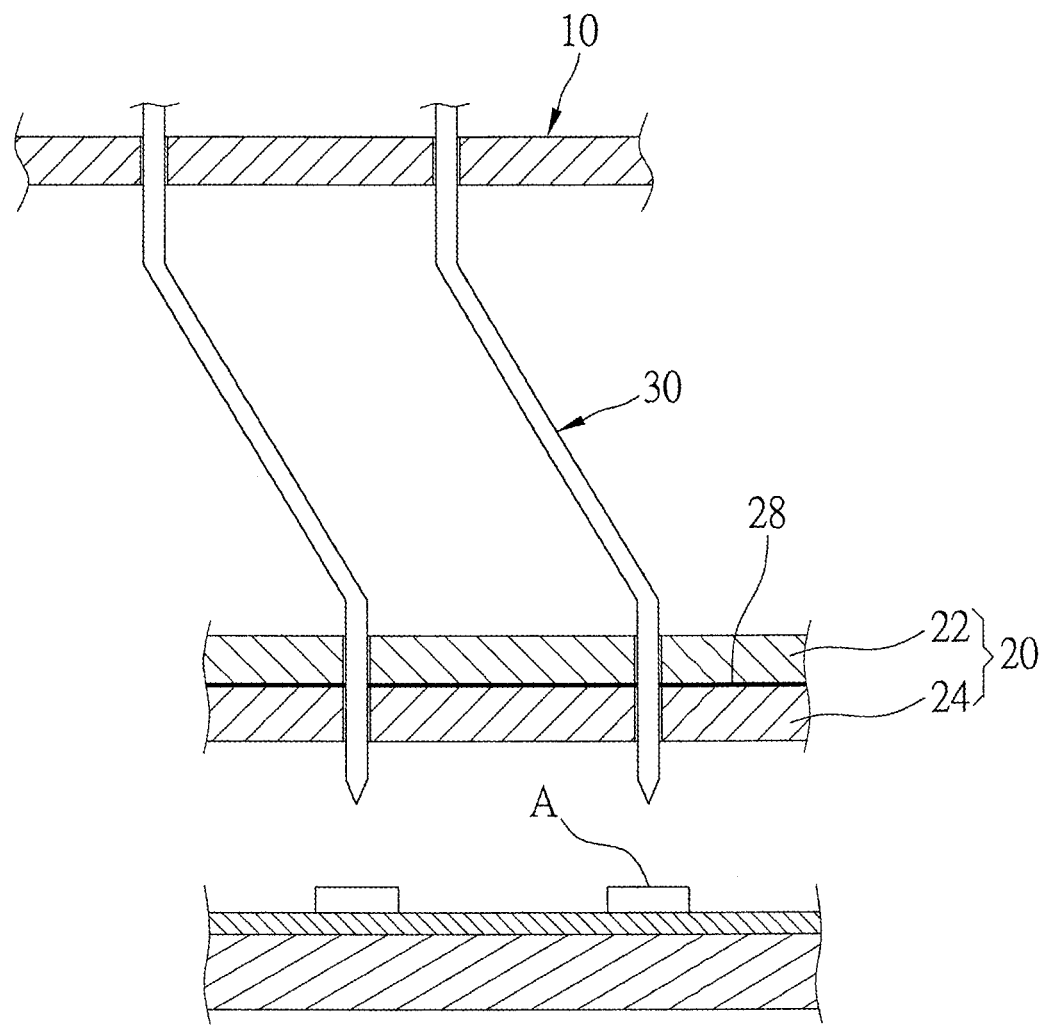
FIG. 4 is similar to FIG. 2 and shows the first board layer and the second board layer joining by the adhering method.

The composite board 20 is disposed under the guide plate 10 at a pre-determined distance. The composite board 20 includes a first board layer 22 and a second board layer 24. The first board layer 22 faces the guide plate 10. A plurality of through holes 26 is disposed on the composite board 20. The through holes 26 are passed all the way through the first board layer 22 and the second board layer 24. According to the embodiment, a manufacturing method of the composite board 20 includes the following steps. At first, the first board layer 22 and the second board layer 24 are laminated together. Then, a joining process is performed so as to join the first board layer 22 and the second board layer 24 together. Thereafter, a drilling process is performed so as to form the through holes 26. The joining process is performed by inserting the joining unit 27 into and joining the first board layer 22 and the second board layer 24 together as shown in FIG. 3. Or the joining process is performed by using the adhesive 28 or other adhering method as shown in FIG. 4. In another embodiment, a liquid plastic material is coated on the ceramic substrate, and an engineering plastic layer is formed after the solidification of the liquid plastic material. After the planarization of the plastic layer, the first board layer is formed. The above description is only the embodiments of the present invention and not limited thereto. In the present invention, the structure of the guide plate 10 can take any form and is not limited to any particular structure.

One end of the probe pin 30 is penetrated through the through holes 12 of the guide plate 10, and electrically connected with the circuit board of the probe card (not shown). Another end of the probe pin 30, i.e. the probe pin tip 32, is penetrated through the through hole 26 of the composite board 20, and is aligned and contacted with the electronic device under test A, whose primary material is silicon. Be noted that the outer diameter of the probe pin 30 is slightly less than the inner diameter of the through hole 26.

The above mentioned embodiment describes the fundamental structure of the probe head 100 of the probe card. In addition, further description of the detailed structure of the probe head 100 are as follows:

In the embodiment, the first board layer 22 is made of the plastic material, and the second board layer 24 is made of the ceramic material. The material property differences between the first board layer 22 and the second board layer 24 cause the physical differences thereof. For example, the friction coefficient of the first board layer 22, made of the plastic material, is smaller than the friction coefficient of the second board layer 24, made of the ceramic material. Furthermore, the thermal expansion coefficient of the second board layer 24, made of the ceramic material, is smaller than the thermal expansion coefficient of the first board layer 24, made of the plastic material. The thickness of the first board layer 22 is smaller than or equal to the thickness of the second board layer 24.

As the probe head 100 of the probe card in this embodiment is used in electrically testing the electronic device under test A, and because the friction coefficient of the first board layer 22, being made of plastic material, is smaller than that of the second board layer 24, being made of ceramic material, therefore, the forming of powder debris due to the rubbing contact between the probe pin 30 and the first board layer 22, the problems relating to poor probe pin mobility and stuck probe pin can all be avoided. The thermal expansion and cold shrinkage caused by the temperature changes during the testing process, therefore, the thermal expansions of the probe head 100 of the probe card and electronic device under test A likely leads to the first board layer 22 to produce the offset of the probe pin 30. However, the probe pin 30 is constrained by the second board layer 24 being made of ceramic material, whose thermal expansion coefficient is close to that of the electronic device under test, so as to preserve and ensure consistent position of the probe pin 30 and make the probe pin tip 32 being aligned with the electronic device under test A. In other words, the offset tolerance of the probe pin will be limited by the gap size of the through hole 26. Therefore, the probe head 100 of the probe card does not have the problem of the powder debris, and the accuracy of the electrical testing is ensured.

Figure 5:
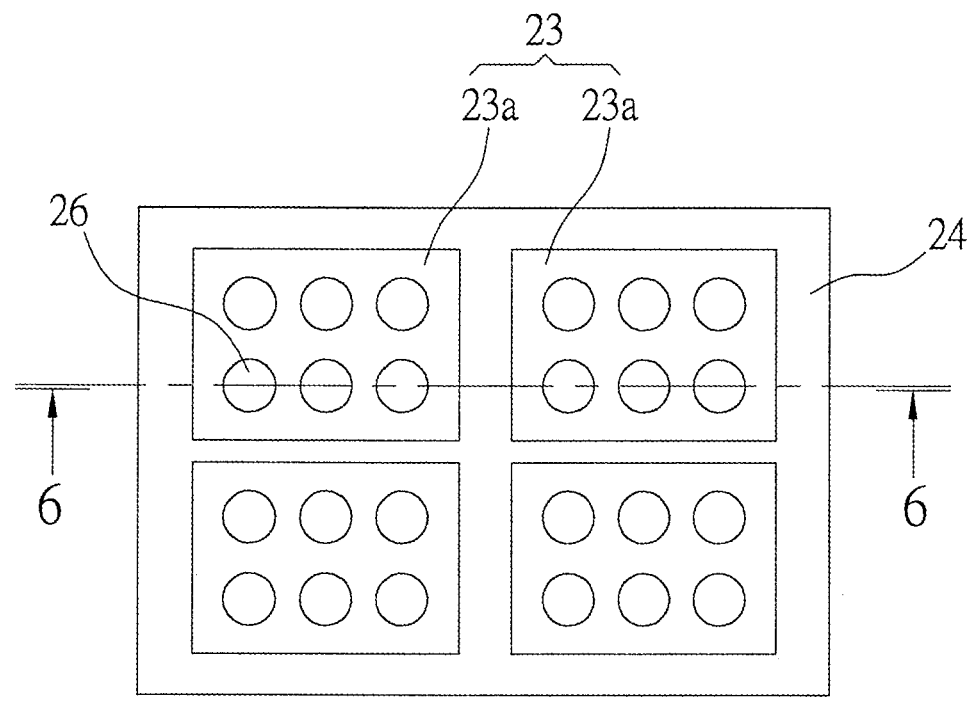
FIG. 5 is a top view of vertical probe card according to another embodiment of the present invention.
Figure 6:
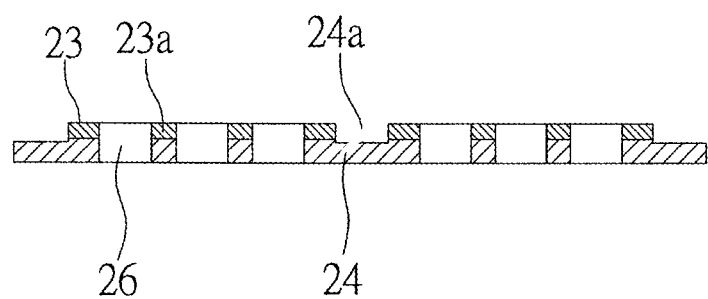
FIG. 6 is a sectional view along line 6-6 in FIG. 5.

In order to reduce the deformation of the ceramic second board layer caused by the thermal deformation of the first board layer made of plastic, the first board layer is made with smaller total area than the second board layer. As shown in the embodiment in FIG. 5 and FIG. 6, the first board layer 23 is divided into a plurality of parts 23a which are fastened on the surface of the second board layer 24. A shallow groove 24a is formed on a portion of the surface of the second board layer 24 which is not covered by the parts 23a. By this, the deformation of the second board layer 24 caused by the deformation of the plastic first board layer 23 can be reduced.

Although the description above contains many specifics, these are merely provided to illustrate the invention and should not be construed as limitations of the invention's scope. Thus it will be apparent to those skilled, in the art that various modifications and variations can be made in the system and processes of the present invention without departing from the spirit or scope of the invention.

What is claimed is:

1. A probe head of a vertical probe card, comprising:
a guide plate;
a composite board, the composite board disposed under the guide plate, the composite board comprising a first board layer and a second board layer, the first board layer and the second board layer being laminated together, and at least one through hole passed through the first board layer and the second board layer, wherein the friction coefficient of the first board layer is smaller than the friction coefficient of the second board layer, and the thermal expansion coefficient of the second board layer is smaller than the thermal expansion coefficient of the first board layer; and
at least one probe pin, one end of the probe pin supported by the guide plate and another end of the probe pin penetrated all the way through the through hole of the composite board, and the outer diameter of the probe pin smaller than the diameter of the through hole of the composite board;
wherein the first board layer is made of a plastic material and the second board layer is made of a ceramic material.

2. The probe head of the vertical probe card as defined in claim 1, wherein the total surface area of the first board layer is smaller than the total surface area of the second board layer.

3. The probe head of the vertical probe card as defined in claim 2, wherein a shallow groove is formed on a portion of the surface of the second board layer which is not covered by the first board layer.

4. The probe head of the vertical probe card as defined in claim 1, wherein the thickness of the first board layer is equal to or smaller than the thickness of the second board layer.

5. The probe head of the vertical probe card as defined in claim 1, wherein the first board layer is made of a plastic material, and the second board layer is made of a ceramic material.

6. The probe head of the vertical probe card as defined in claim 5, wherein the total surface area of the first board layer is smaller than the total surface area of the second board layer, the first board layer is facing the guide plate and the second board layer is facing the electronic device under test.

7. A manufacturing method of a composite board of a probe head of a vertical probe card, comprising the steps of:
providing a first board layer;
providing a second board layer, wherein the friction coefficient of the first board layer is smaller than the friction coefficient of the second board layer, and the thermal expansion coefficient of the second board layer is smaller than the thermal expansion coefficient of the first board layer;

performing a joining operation so as to laminate the first board layer and the second board layer together; and performing a drilling operation so as to form at least one through hole which is passed all the way through the first board layer and the second board layer;

wherein the first board layer is made of a plastic material and the second board layer is made of a ceramic material.

8. The manufacturing method of the composite board of the probe head of the vertical probe card as defined in claim 7, wherein the joining operation is performed by using a locking method.

9. The manufacturing method of the composite board of the probe head of the vertical probe card as defined in claim 7, wherein the joining operation is performed by using an adhering method.

* * * * *